(12) United States Patent
Halbritter et al.

(10) Patent No.: US 11,513,420 B2
(45) Date of Patent: Nov. 29, 2022

(54) RADIATION SOURCE FOR EMITTING TERAHERTZ RADIATION

(71) Applicant: OSRAM OLED GmbH, Regensburg (DE)

(72) Inventors: Hubert Halbritter, Dietfurt (DE); Roland Heinrich Enzmann, Gelugor (MY)

(73) Assignee: OSRAM OLED GMBH, Regensburg (DE)

( * ) Notice: Subject to any disclaimer, the term of this patent is extended or adjusted under 35 U.S.C. 154(b) by 306 days.

(21) Appl. No.: 16/769,161

(22) PCT Filed: Dec. 5, 2018

(86) PCT No.: PCT/EP2018/083687
§ 371 (c)(1),
(2) Date: Jun. 2, 2020

(87) PCT Pub. No.: WO2019/110682
PCT Pub. Date: Jun. 13, 2019

(65) Prior Publication Data
US 2021/0215994 A1  Jul. 15, 2021

(30) Foreign Application Priority Data

Dec. 7, 2017 (DE) .......................... 102017129173.3

(51) Int. Cl.
*G02F 2/00* (2006.01)
*H01S 5/00* (2006.01)
(Continued)

(52) U.S. Cl.
CPC .............. *G02F 2/002* (2013.01); *H01S 5/005* (2013.01); *H01S 5/4087* (2013.01); *H01S 5/423* (2013.01)

(58) Field of Classification Search
CPC ........ G02F 2/002; H01S 5/005; H01S 5/4087; H01S 5/423
(Continued)

(56) References Cited

U.S. PATENT DOCUMENTS 6,122,417 A * 9/2000 Jayaraman ......... G02B 6/29358
372/50.23
2002/0097771 A1  7/2002 Hwang et al.
(Continued)

FOREIGN PATENT DOCUMENTS

DE  102008021791 A1  11/2009
DE  112013004626 T5   7/2015
(Continued)

OTHER PUBLICATIONS

Plinski et al; Terahertz photo mixer; Dec. 2010; Bulletin of the Polish Academy of Sciences; pp. 1-9. (Year: 2010).*
(Continued)

*Primary Examiner* — Amritbir K Sandhu
(74) *Attorney, Agent, or Firm* — MH2 Technology Law Group LLP

(57) ABSTRACT

A radiation source for emitting terahertz radiation (6) is specified, comprising at least two laser light sources emitting laser radiation (11, 12) of different frequencies, and a photomixer (5) comprising a photoconductive semiconductor material (51) and an antenna structure (52), the photomixer (5) being configured to emit the laser radiation (11, 12) of the laser light sources (1, 2) and emitting terahertz radiation (6) with at least one beat frequency of the laser light sources, and wherein the at least two laser light sources are surface-emitting semiconductor lasers (1, 2) which are arranged in a one-dimensional or two-dimensional array on a common carrier (10).

15 Claims, 5 Drawing Sheets

Figure 1A:
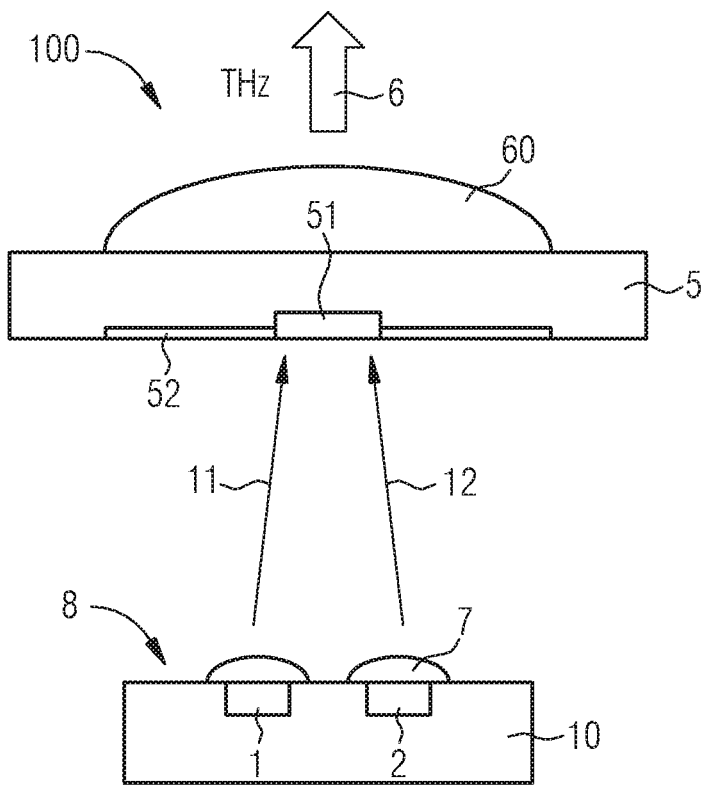

(51) Int. Cl.
*H01S 5/40* (2006.01)
*H01S 5/42* (2006.01)

(58) Field of Classification Search
USPC .......................................................... 250/504
See application file for complete search history.

(56) References Cited

U.S. PATENT DOCUMENTS

| | | | |
|---|---|---|---|
| 2010/0158056 A1* | 6/2010 | Shin | H01S 5/06256 |
| | | | 372/29.016 |
| 2012/0051383 A1 | 3/2012 | Stern | |
| 2012/0326039 A1* | 12/2012 | Demers | G01N 21/3581 |
| | | | 250/338.4 |
| 2014/0197425 A1* | 7/2014 | Moon | H01L 31/03046 |
| | | | 257/432 |
| 2014/0354366 A1* | 12/2014 | Suzuki | H01S 5/3013 |
| | | | 331/94.1 |
| 2017/0256913 A1 | 9/2017 | Garnache-Creuillot et al. | |
| 2017/0271851 A1 | 9/2017 | Hanaoka | |
| 2021/0215994 A1* | 7/2021 | Halbritter | H01S 5/4087 |

FOREIGN PATENT DOCUMENTS

| | | | |
|---|---|---|---|
| KR | 20130073450 A | * 7/2013 | |
| WO | WO-2004097382 A1 | * 11/2004 | G01N 21/35 |

OTHER PUBLICATIONS

Paquet et al.; Vertical-External-Cavity Surface-Emitting Laser for THz Generation; Sep. 2014; IEEE; pp. 1-2. (Year: 2014).*

Wang et al., "Tri-channel single-mode terahertz quantum cascade laser", Optics Letters, vol. 39, No. 23, Dec. 1, 2014, 4 pages.

Plínski, "Terahertz photomixer", Bulletin of the Polish Academy of Sciences Technical Sciences, vol. 58, No. 4, 2010, 8 pages.

* cited by examiner

RADIATION SOURCE FOR EMITTING TERAHERTZ RADIATION

CROSS-REFERENCE TO RELATED APPLICATION(S)

The present application concerns a radiation source for emitting terahertz radiation.

This patent application is a national stage entry from International Application No. PCT/EP2018/083687, filed on Dec. 5, 2018, published as International Publication No. WO 2019/110682 A1 on Jun. 13, 2019, and claims priority under 35 U.S.C. § 119 from German patent application 10 2017 129 173.3, filed Dec. 7, 2017, the entire contents of all of which are incorporated herein by reference.

Terahertz radiation is electromagnetic radiation which lies in the electromagnetic spectrum between infrared radiation and microwaves. Terahertz radiation is understood here and in the following to mean in particular electromagnetic radiation with frequencies between 0.1 THz and 30 THz.

Since the generation and emission of terahertz radiation with frequencies of more than 0.1 THz is very complex compared to other frequency ranges of the electromagnetic spectrum and was not possible or only possible to a very limited extent for a long time, one also speaks of a so-called terahertz gap in the electromagnetic spectrum. Especially the production of miniaturized, compact radiation sources in the terahertz radiation range is problematic.

From the publication E. F. Pliński, "Terahertz Photomixer", Bulletin of the Polish Academy of Sciences: Technical Sciences, Vol. 58, No. 4 (2010), 463-470, a terahertz radiation source is known which has a so-called photomixer. In the photomixer, radiation from two laser light sources of different frequencies is directed onto a photoconductive semiconductor material, which is provided with an antenna structure. The two laser light sources generate an interference signal which has the beat frequency $f_2-f_1$, where $f_1$ is the frequency of the first laser light source and $f_2$ is the frequency of the second laser light source. The interference signal generates an electric field in the semiconductor material with the beat frequency $f_2-f_1$, which is emitted by the antenna structure as an electromagnetic wave with a frequency in the terahertz range.

One task to be solved according to one aspect of the present application is to provide a radiation source for the generation of terahertz radiation that is as compact and effective as possible.

This task is solved by a radiation source for emitting terahertz radiation according to the independent claim.

Advantageous configurations and further development of the terahertz radiation source are the subject of the dependent claims.

According to at least one embodiment, the radiation source for emitting terahertz radiation comprises at least two laser light sources emitting radiation of different frequencies. In particular, the radiation source comprises a first laser light source emitting radiation with a first frequency $f_1$. Furthermore, the radiation source comprises a second laser light source which emits radiation with a second frequency $f_2$. It is possible that the radiation source has more than two laser light sources. In this case it is possible that the laser light sources emit radiation with more than two different frequencies. The laser light sources can emit radiation in the infrared spectral range in particular.

Furthermore, the radiation source for the emission of terahertz radiation includes a photomixer. A photomixer is understood here and in the following to be a component which is configured to receive the radiation of the laser light sources and to emit terahertz radiation with at least one beat frequency of the laser light sources. In the case of two laser light sources, the at least one beat frequency of the laser light sources is the difference frequency $f_2-f_1$ of the two different frequencies of the laser light sources. For example, if the laser light sources have wavelengths of 850 nm and 851 nm, the beat frequency is about 400 GHz. If the radiation source has more than two laser light sources with more than two different frequencies, terahertz radiation with several discrete frequencies in the terahertz range is generated, thus creating a broadband terahertz radiation source.

The basic design of a photomixer for the generation of terahertz radiation is known to the expert per se from the publication E. F. Pliński, "Terahertz Photomixer", Bulletin of the Polish Academy of Sciences: Technical Sciences, Vol. 58, No. 4 (2010), 463-470, quoted in the introduction, the contents of which are hereby fully incorporated by reference with regard to the operation of the photomixer. The photomixer features in particular a photoconductive semiconductor material and an antenna structure. The radiation of the two laser light sources overlaps in the area of the photoconductive semiconductor material. This generates an electric field which is modulated with the beat frequency. Radiation at the beat frequency is emitted via the antenna structure.

According to at least one embodiment of the radiation source for emitting terahertz radiation, the at least two laser light sources are surface-emitting semiconductor lasers. A surface-emitting semiconductor laser is also called a VCSEL (Vertical Cavity Surface Emitting Laser) and has an emission direction perpendicular to the semiconductor layer sequence of the surface-emitting semiconductor laser. A surface-emitting semiconductor laser has in particular a first resonator mirror and a second resonator mirror, which are realized in particular as DBR mirrors. An active layer is arranged between the resonator mirrors, which can in particular be configured as a single or multiple quantum well structure. The use of surface-emitting semiconductor lasers as laser light sources for the radiation source has on the one hand the advantage that radiation with a high power density can be generated with surface-emitting semiconductor lasers in order to generate terahertz radiation with the beat frequency in the photomixer particularly effectively. Furthermore, surface-emitting semiconductor lasers are characterized by a low temperature drift of the emission wavelength, since the emission wavelength of surface-emitting semiconductor lasers is essentially determined by the length of the cavity between the upper and lower resonator mirrors, the temperature dependence of which is only small.

According to at least one embodiment of the radiation source, the surface-emitting semiconductor lasers are arranged in a one-dimensional or two-dimensional array on a common carrier. The arrangement of the surface-emitting semiconductor lasers in a one-dimensional or two-dimensional array on a common carrier has in particular the advantage that the surface-emitting semiconductor lasers are thermally coupled to one another via the common carrier. A change in temperature therefore affects the at least two surface-emitting semiconductor lasers in essentially the same way, so that the beat frequency, which is equal to the frequency of the radiated terahertz radiation, does not change essentially. The radiation source for terahertz radiation is therefore comparatively insensitive to temperature compared to a radiation source with discrete laser light sources.

According to at least one embodiment, the common carrier is a growth substrate on which the surface-emitting semiconductor lasers are grown. In particular, the surface-emitting semiconductor lasers can be grown monolithically on the common growth substrate. Here, "monolithically grown" means that the surface-emitting semiconductor lasers each have an epitaxial layer sequence which has been completely or at least partially produced in the same epitaxial process. Due to the monolithic integration of the two surface-emitting semiconductor lasers on a common growth substrate, the adjustment effort required to adjust the two laser light sources relative to one another is eliminated in particular compared to a radiation source with discrete laser diodes. Furthermore, a comparatively compact and robust radiation source is achieved in this way.

According to at least one embodiment, the common carrier, in particular a common growth substrate of the two surface-emitting semiconductor lasers, is a GaAs substrate. A GaAs substrate is particularly suitable for growing arsenide compound semiconductor materials.

According to at least one embodiment, the surface-emitting semiconductor lasers are based on an arsenide compound semiconductor, a phosphide compound semiconductor or an antimonide compound semiconductor. In particular, the surface-emitting semiconductor lasers comprise a III-V semiconductor material in which the component from group V of the periodic table comprises at least one of the elements As, P or Sb. It is also possible that the semiconductor material comprises two or three of the elements As, P or Sb.

For example, the surface-emitting semiconductor lasers are based on an arsenide compound semiconductor. "Based on an arsenide compound semiconductor" means in the present context that the active epitaxial layer sequence or at least one layer thereof comprises an arsenide compound semiconductor material, preferably $Al_nGa_mIn_{1-n-m}As$, where $0 \le n \le 1$, $0 \le m \le 1$ and $n+m \le 1$, whereby this material does not necessarily have a mathematically exact composition according to the above formula. Rather, it may have one or more dopants and additional components. For simplicity's sake, however, the above formula only includes the essential components of the crystal lattice (Al, Ga, In, As), even though these may be partially replaced by small amounts of other substances. Arsenide compound semiconductors are particularly suitable for the emission of radiation from visible red light to the near infrared spectral range.

It is also possible that the surface-emitting semiconductor lasers comprise $Ga_xIn_{1-x}Sb_yP_zAs_{1-y-z}$ with $0 \le x \le 1$, $0 \le y \le 1$, $0 \le z \le 1$ and $y+z \le 1$. Preferably $y > 0$ and/or $z > 0$, i.e. the semiconductor material is an antimonide or phosphide semiconductor material. Semiconductor materials from this material system, for example InP, are particularly suitable for emitting radiation in the mid-infrared spectral range.

According to at least one embodiment, the surface-emitting semiconductor lasers have wavelengths in the wavelength range between 840 nm and 1600 nm. It is possible, for example, that the surface-emitting semiconductor lasers have emission wavelengths in the range from about 840 nm to about 950. In this case, the surface-emitting semiconductor lasers may have an AlInGaAs semiconductor material, for example. It is also possible that the surface-emitting semiconductor lasers have emission wavelengths in the range from about 1300 nm to about 1600. In this case, the surface-emitting semiconductor lasers may have a GaInAsSbP semiconductor material, for example.

According to at least one embodiment, the number of surface-emitting semiconductor lasers of the radiation source is exactly two. In this embodiment, the radiation source emits terahertz radiation of a single frequency. In this case, the frequency of the emitted terahertz radiation is equal to the difference frequency $f_2-f_1$ of the two surface-emitting semiconductor lasers.

In an alternative embodiment, the number of surface-emitting semiconductor lasers of the radiation source is at least three, so that the radiation source emits terahertz radiation of different frequencies. In this configuration, the radiation source comprises in particular surface-emitting semiconductor lasers which have more than two different frequencies. Accordingly, there are more than two beat frequencies in the terahertz frequency range which are emitted by the radiation source.

According to at least one embodiment, the terahertz radiation has one or more frequencies in the frequency range between 0.1 THz and 30 THz.

According to at least one embodiment, the surface-emitting semiconductor lasers each have a beam-shaping element arranged on the one- or two-dimensional array. The beam shaping element can, for example, be a lens for collimating and/or focusing the laser radiation. The arrangement of the beam shaping elements on the array results in a compact design and reduces the adjustment effort compared to separately arranged beam shaping elements.

According to at least one embodiment, the surface-emitting semiconductor lasers each have a laser resonator formed by a first resonator mirror and a second resonator mirror, the laser resonators having a length difference for adjusting the beat frequency.

The resonator mirrors of the surface-emitting semiconductor lasers can be formed by DBR mirrors, for example. DBR mirrors have a plurality of alternating semiconductor layers in a periodic arrangement. The semiconductor layer sequence arranged between the first resonator mirror and the second resonator mirror of the surface-emitting semiconductor lasers comprises in particular the active layer provided for the emission of radiation.

The difference in length of the laser resonators and the resulting difference in the emission wavelengths can be achieved in particular by the semiconductor layer sequence arranged between the first resonator mirror and the second resonator level having a different thickness in the surface-emitting semiconductor lasers.

According to at least one embodiment, the laser resonator of at least one of the surface-emitting semiconductor lasers has a spacer layer for adjusting the difference in length. In particular, it is possible that during the production of the semiconductor layer sequence of at least one of the surface-emitting semiconductor lasers, the spacer layer is additionally deposited, the thickness of which defines the length difference of the laser resonators.

According to at least one embodiment of the radiation source, the length difference of the laser resonators of the at least two surface-emitting semiconductor lasers is between 0.1 nm and 6 nm. In this way, an advantageously low frequency difference between the at least two surface-emitting semiconductor lasers can be set. Such a small difference in the resonator lengths can be set advantageously with high accuracy during the epitaxial deposition of the semiconductor layer sequences of the surface-emitting semiconductor lasers.

According to at least one embodiment, the array of surface-emitting semiconductor lasers is firmly connected to the photomixer. The array of the surface-emitting semiconductor lasers can be firmly connected to the photomixer, in particular by material bonding, for example with a compound layer. In this way, a compact radiation source is obtained, which can be manufactured at low cost. The array of surface-emitting semiconductor lasers can, for example, be bonded to the photomixer with an adhesive layer.

According to at least one embodiment of the radiation source, the common carrier of the surface-emitting semiconductor lasers faces the photomixer. In this configuration, the common carrier of the surface-emitting semiconductor lasers can in particular be the growth substrate of the surface-emitting semiconductor lasers, for example a GaAs substrate.

In a preferred configuration, the photomixer also comprises a GaAs substrate. The substrate of the photomixer and the common carrier of the surface-emitting semiconductor lasers can advantageously be directly connected to each other, for example by wafer bonding.

According to at least one embodiment, the surface-emitting semiconductor lasers emit the laser radiation through the common carrier, for example through the common growth substrate. In this case, the surface-emitting semiconductor lasers are so-called bottom emitters. This design has the advantage that the thickness of the carrier creates a distance between the array of surface-emitting semiconductor lasers and the photomixer. In this way, a good overlapping of the laser beams can be achieved even if the array of surface-emitting semiconductor lasers is directly connected to the photomixer.

The invention is explained in more detail below by means of examples in connection with FIGS. 1 to 6.

Figure 1B:
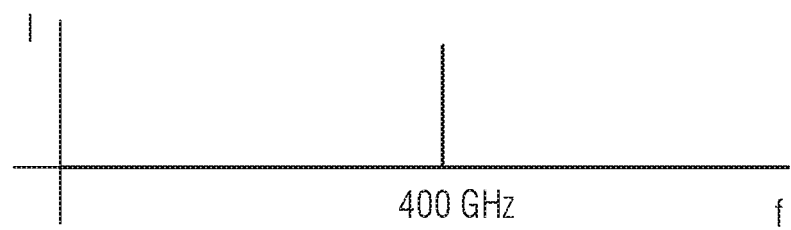
Figure 2A:
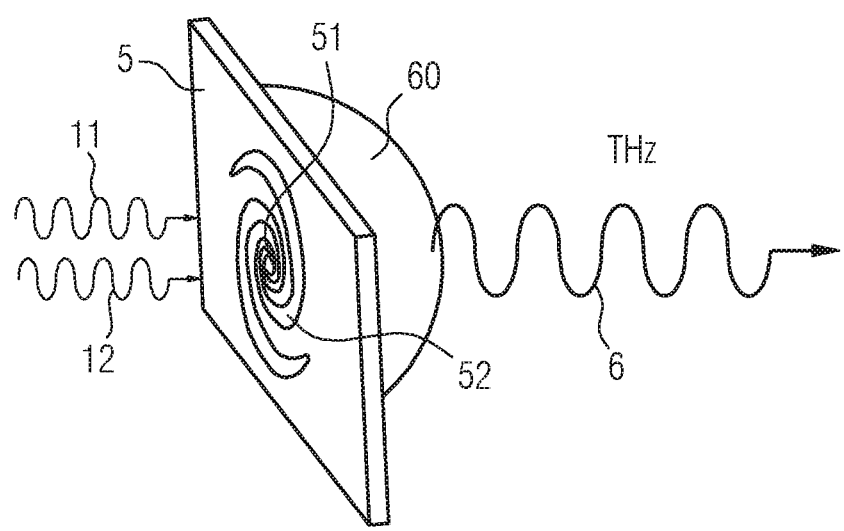
Figure 2B:
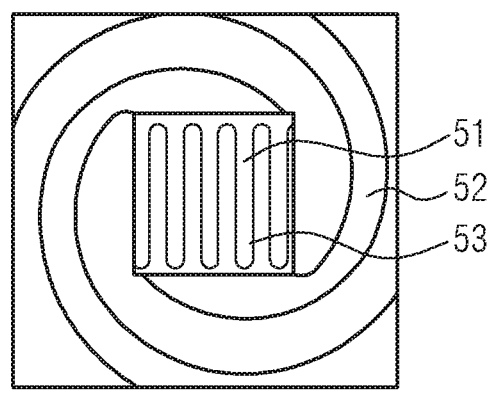
Figure 3A:
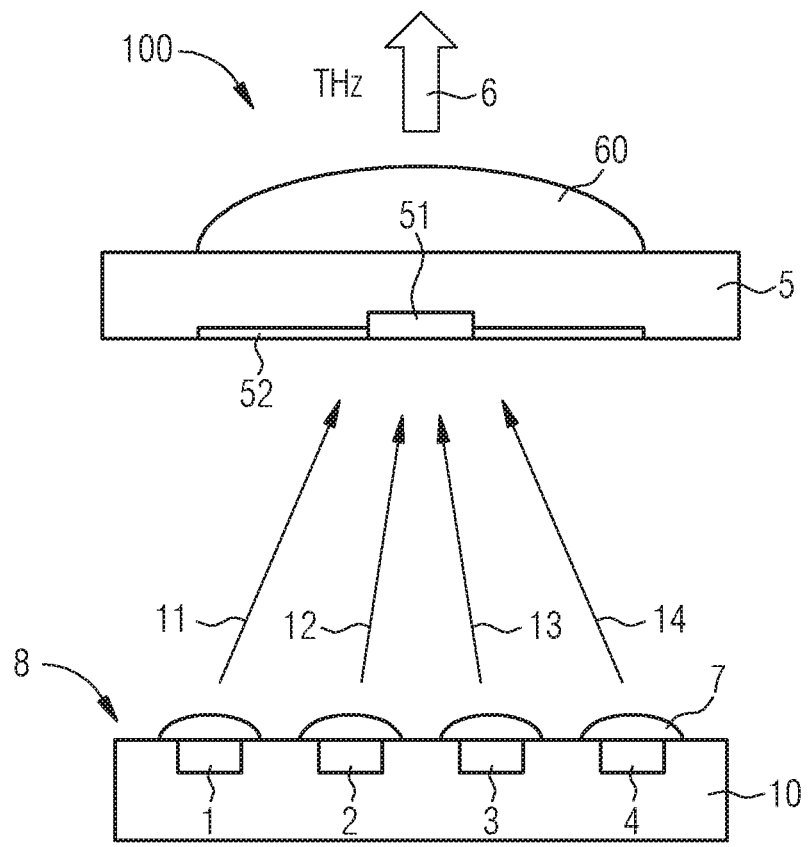
Figure 3B:
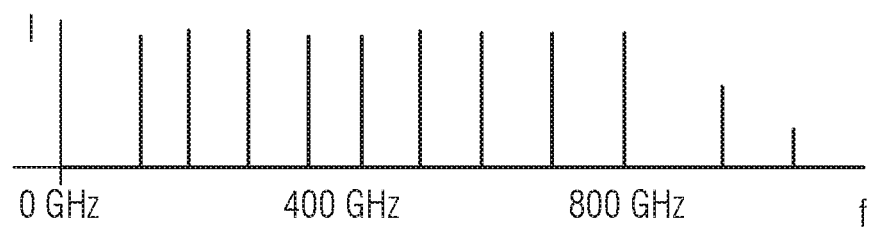
Figure 4:
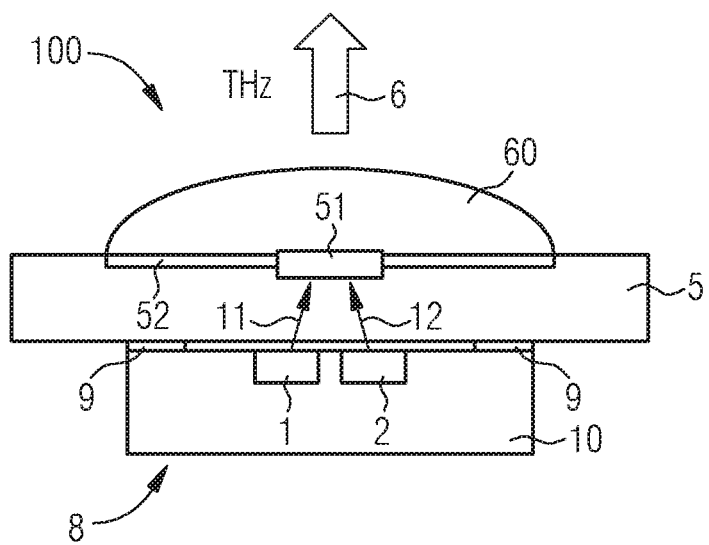
Figure 5:
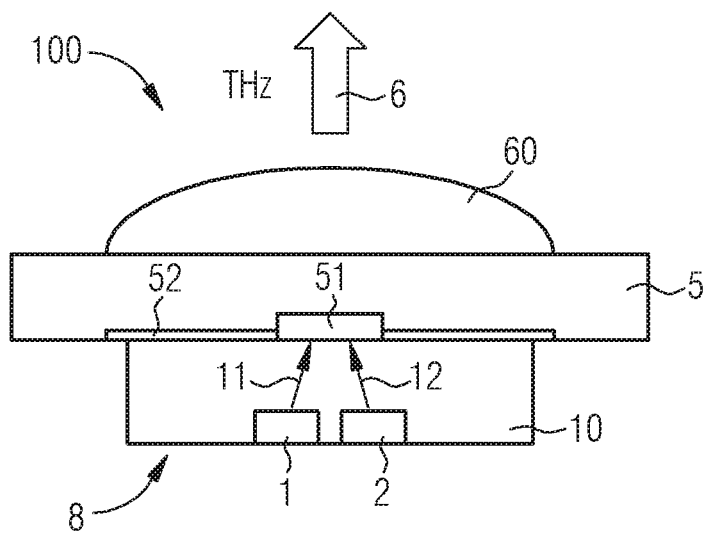
Figure 6:
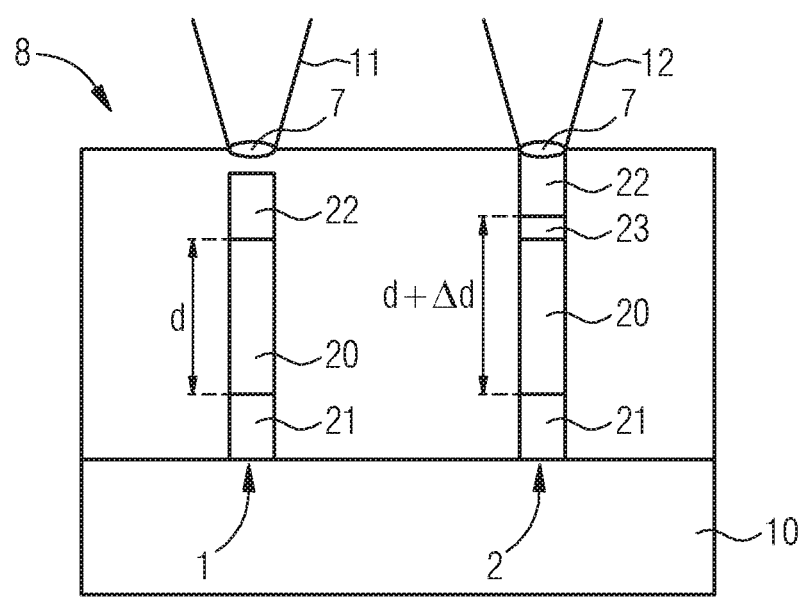

In the Figures:

FIG. 1A shows a schematic representation of a cross-section through a terahertz radiation source according to a first example, FIG. 1B shows a schematic diagram of the emitted spectrum of terahertz radiation in an example with exactly two laser light sources, FIG. 2A shows a schematic diagram of the generation of terahertz radiation from the laser radiation of two laser light sources, FIG. 2B is a schematic diagram of a view of an example of the photoconductive semiconductor material and antenna structure, FIG. 3A a schematic representation of a cross-section through a terahertz radiation source according to a second example, FIG. 3B is a schematic diagram of the emitted frequency spectrum of terahertz radiation in the second example, FIG. 4 is a schematic representation of a cross-section through a terahertz radiation source according to a third example, FIG. 5 a schematic representation of a cross-section through a terahertz radiation source according to a fourth example, and FIG. 6 shows a schematic diagram of an array of two surface-emitting semiconductor lasers according to an example.

Identical elements or elements with the same effect are marked with the same reference signs in the figures. The sizes of the depicted elements as well as the proportions of the elements to each other are not to be considered as true to scale.

FIG. 1A shows a first embodiment of the radiation source 100 for generating terahertz radiation 6. The radiation source 100 comprises two laser light sources, which are surface-emitting semiconductor lasers 1, 2. The first surface-emitting semiconductor laser 1 emits laser radiation 11 at a first frequency $f_1$. The further surface-emitting semiconductor laser 2 emits laser radiation 12 at a second frequency $f_2$. In the example, the surface-emitting semiconductor lasers 1, 2 each have a beam shaping element 7 which is provided for collimating and/or focusing the emitted laser radiation 11, 12.

Furthermore, the radiation source 100 for terahertz radiation 6 has a photomixer 5, which is configured to receive the laser radiation 11, 12 of the laser light sources 1, 2 and to emit terahertz radiation 6. The terahertz radiation 6 has the beat frequency of the laser light sources 1, 2, which is equal to the difference frequency $f_2-f_1$ of the two laser light sources 1, 2. To generate the terahertz radiation 6, the photomixer 5 has a photoconductive semiconductor material 51 and an antenna structure 52. The laser radiation 11, 12 emitted by the surface-emitting semiconductor lasers 1, 2 overlaps in the area of the photoconductive semiconductor material 51, so that in the photoconductive semiconductor material 51 charge carriers are generated with the beat frequency. The photoconductive semiconductor material 51 can, for example, be provided with a bias voltage and, in particular, be provided with an electrode structure for this purpose. It is also possible that the photoconductive semiconductor material 51 is a photodiode.

The photoconductive semiconductor material 51 of the photomixer 5 is connected to an antenna structure 52, which is provided for emitting terahertz radiation 6 with the beat frequency of the laser light sources 1, 2. The photoconductive semiconductor material 51 of the photomixer can be GaAs, for example. The antenna structure 52 is preferably formed from a metal and can be applied in structured form to a base body of the photomixer 5 or incorporated into the base body. In the example, the antenna structure 52 is arranged on a side of photomixer 5 facing the laser light sources 1, 2. On a side facing away from the laser light sources 1, 2, the photomixer 5 preferably has a lens 60 in order to effect a beam shaping of the emitted terahertz radiation 6. Silicon is particularly suitable as the material for the lens 60.

The at least two surface-emitting semiconductor lasers 1, 2 are arranged in the radiation source 100 in a one- or two-dimensional array 8 on a common carrier 10. The arrangement of the surface-emitting semiconductor lasers 1, 2 on the common carrier 10 has the particular advantage that the surface-emitting semiconductor lasers 1, 2 are thermally coupled to one another via the common carrier. Consequently, temperature fluctuations advantageously affect the two surface-emitting semiconductor lasers 1, 2 in essentially the same way. This has the advantage that the beat frequency $f_2-f_1$ of the two surface-emitting semiconductor lasers essentially does not change when the operating temperature changes.

Furthermore, the arrangement of the surface-emitting semiconductor lasers 1, 2 in an array 8 on a common carrier 10 results in a particularly compact design, which enables miniaturization of the terahertz radiation source 100.

The use of the surface-emitting semiconductor lasers 1, 2 in the radiation source 100 is particularly advantageous because surface-emitting semiconductor lasers 1, 2 are characterized in particular by a low temperature drift of the emission wavelength, in contrast to conventional laser diodes. This is due in particular to the fact that the emission wavelength of surface-emitting semiconductor lasers is essentially determined by the length of the cavity between the upper and lower resonator mirrors. This can change only very slightly with a change in temperature due to the temperature dependence of the refractive index of the semiconductor material. In contrast to conventional LEDs or laser diodes, the temperature dependence of the gain in the laser medium does not significantly affect the emission wavelength in a VCSEL.

For example, the semiconductor layer sequences of the surface-emitting semiconductor lasers 1, 2 can be based on an arsenide semiconductor material, a phosphide semiconductor material or an antimonide semiconductor material. For example, the semiconductor layer sequences can each be based on an arsenide compound semiconductor material, whereby the emission wavelengths of the surface-emitting semiconductor lasers can lie in particular in the wavelength range between 840 nm and 950 nm. Alternatively, it is possible, for example, that the semiconductor layer sequences of the surface-emitting semiconductor lasers each comprise indium phosphide and the emission wavelengths lie in the wavelength range between 1300 nm and 1600 nm. For example, the difference in wavelengths between the first surface-emitting semiconductor laser 1 and the second surface-emitting semiconductor laser 2 is between 1 nm and 10 nm.

FIG. 1B shows an example of a possible frequency spectrum of the radiation source 100 according to the example in FIG. 1A. If the radiation source 100 has only two surface-emitting semiconductor lasers 1, 2, terahertz radiation 6 is emitted with an intensity I at a single frequency f, which can be about 400 GHz, for example. This frequency f corresponds to the beat frequency, i.e. the difference frequency of the two surface-emitting semiconductor lasers 1, 2, when the wavelength difference of the two surface-emitting semiconductor lasers 1, 2 is about 1 nm. The frequency of the terahertz radiation can generally be between about 0.1 THz and 30 THz, depending on the frequency difference between the two surface-emitting semiconductor lasers.

FIG. 2A schematically shows the generation of terahertz radiation 6 using the photomixer 5. The laser radiation 11 of the first surface-emitting semiconductor laser and the laser radiation 12 of the second surface-emitting semiconductor laser impinge on the photomixer 5 and overlap in the area of the photoconductive semiconductor material 51. In the photoconductive semiconductor material 51, charge carriers are moved at the beat frequency of the laser beams 11, 12. Here, the photoconductive semiconductor material 51 is connected to an antenna structure 52, which emits terahertz radiation 6 at the beat frequency. For beam shaping of the terahertz radiation 6, a lens element 60 is attached to the photomixer 5, the lens element 60 preferably comprising silicon.

FIG. 2B shows an enlarged view of the photoconductive semiconductor material 51 and the antenna structure 52. The photoconductive semiconductor material 51 may, for example, be provided with an electrode structure 53, which may in particular be passed over the semiconductor material in a meandering manner. In this way, for example, a bias voltage can be applied to the photoconductive semiconductor material 51. A photodiode, for example, can also serve as photoconductive semiconductor material 51. The antenna structure 52 connected to the photoconductive semiconductor material 51 can, for example, be a spirally formed metallization.

FIG. 3A shows another example of the design of the terahertz radiation source 100. This design example differs from the design example in FIG. 1A in that the radiation source 100 has more than two surface-emitting semiconductor lasers. For example, the radiation source 100 can have four surface-emitting semiconductor lasers 1, 2, 3, 4, which are arranged in a one-dimensional linear array, for example. The surface-emitting semiconductor lasers 1, 2, 3, 4 preferably each have beam-shaping optics 7, which are configured to cause the emitted laser beams 11, 12, 13, 14 to overlap in the region of the photoconductive semiconductor material 51 of the photomixer 5.

Instead of a one-dimensional array, the multiple surface-emitting semiconductor lasers 1, 2, 3, 4 could also be arranged in a two-dimensional array. The use of a plurality of surface-emitting semiconductor lasers 1, 2, 3, 4 has the particular advantage that a high radiation intensity is achieved in the area of the photoconductive semiconductor material 51, so that terahertz radiation 6 is generated particularly effectively.

FIG. 3B shows a possible frequency spectrum of the radiation source 100 for the case that the surface-emitting semiconductor lasers 1, 2, 3, 4 have several different frequencies. In this case, several beat frequencies of the laser beams 11, 12, 13, 14 result, so that terahertz radiation with an intensity I is emitted at several different frequencies f. The frequency spectrum of the terahertz radiation source 100 is therefore composed of several discrete terahertz frequencies. For example, the several surface-emitting semiconductor lasers can have different wavelengths, which are distributed, for example, in the wavelength range from 849 nm to 851 nm.

FIG. 4 shows a further embodiment of the radiation source 100. This example differs from the example in FIG. 1A in that the array 8 of the surface-emitting semiconductor lasers 1, 2 is directly connected to the photomixer 5. For example, the array 8 of the surface-emitting semiconductor lasers 1, 2 can be connected to the photomixer 5 by means of a bonding layer 9, in particular an adhesive layer. Alternatively, it would also be possible to connect the array 8 to the photomixer 5 by wafer bonding. By directly connecting the array 8 of the surface-emitting semiconductor lasers 1, 2 with the photomixer, a particularly compact radiation source 100 is achieved, which is also particularly stable in terms of adjustment. To achieve a sufficient overlap of the laser beams 11, 12 in the area of the photoconductive semiconductor material 51 of the photomixer 5, it is possible to arrange a spacer (not shown) between the array 8 of the surface-emitting semiconductor lasers 1, 2 and the photomixer 5.

Furthermore, as shown in FIG. 4, it is possible to arrange the photoconductive semiconductor material 51 and the antenna structure 52 on a side of the photomixer 5 facing away from the array 8 in order to purposefully adjust the distance between the surface-emitting semiconductor lasers 1, 2 and the photoconductive semiconductor material 51. This is particularly possible if a base body of the photomixer 5, for example a gallium arsenide substrate, is transparent to the radiation emitted by the surface-emitting semiconductor lasers 1, 2. Gallium arsenide is particularly transparent for wavelengths of more than about 905 nm. It is possible, for example, that the surface-emitting semiconductor lasers 1, 2 have a wavelength of more than 905 nm, for example in the range of about 950 nm, and radiate through the substrate of photomixer 5.

FIG. 5 shows another embodiment of the radiation source 100, in which the array 8 of surface emitting semiconductor lasers 1, 2 is directly connected to the photomixer 5. In this example, the surface-emitting semiconductor lasers 1, 2 are arranged on a side of the common carrier 10 facing away from the photomixer 5. In this example, the common carrier 10 of the surface-emitting semiconductor lasers 1, 2 is transparent for the laser radiation 11, 12 emitted by the surface-emitting semiconductor lasers 1, 2. The common carrier 10 can be, for example, a GaAs substrate which is transparent for the emitted laser radiation 11, 12. This is particularly the case if the emission wavelengths of the surface-emitting semiconductor lasers 1, 2 are more than 905 nm. In other words, the surface-emitting semiconductor lasers 1, 2 are so-called bottom emitters which emit laser radiation 11, 12 through the growth substrate 10 in the direction of the photomixer 5.

In particular, the growth substrate 10 acting as a common carrier 10 can be used to create a distance between the surface-emitting semiconductor lasers 1, 2 and the photoconductive semiconductor material 51 of the photomixer 5. It is thus particularly possible that the photoconductive semiconductor material 51 and the antenna structure 52 of the photomixer are arranged on the side facing the array 8 of the surface-emitting semiconductor lasers 1, 2. In contrast to the previous design example, in this design example the array 8 of the surface-emitting semiconductor lasers 1, 2 is not connected to the photomixer 5 by means of a connection layer, but directly by wafer bonding.

FIG. 6 shows a schematic cross-section of an array 8 of two surface-emitting semiconductor lasers 1, 2, which can be used in radiation source 100. The two surface-emitting semiconductor lasers 1, 2 are arranged on a common carrier 10, which can be a common growth substrate in particular. The surface-emitting semiconductor lasers 1, 2 each have a first resonator mirror 21 and a second resonator mirror 22. The first resonator mirror 21 and/or the second resonator mirror 22 can be formed in particular as DBR mirrors. DBR mirrors have a large number of periodically arranged layers which differ from one another in their refractive index.

Between the resonator mirrors 21, 22 of the surface-emitting semiconductor lasers 1, 2 there is arranged in each case a semiconductor layer sequence 20, which contains in particular the active layer of the surface-emitting semiconductor lasers 1, 2. The active layer can be formed, for example, as a pn junction, a double heterostructure, a single quantum well structure or a multiple quantum well structure. The term quantum well structure covers any structure in which charge carriers are quantised by confinement of their energy states. In particular, the term quantum well structure does not contain any information about the dimensionality of the quantization. It therefore includes quantum wells, quantum wires and quantum dots and any combination of these structures.

To set a frequency difference between the laser radiation 11 emitted by the first surface-emitting semiconductor laser 1 and the laser radiation 12 emitted by the second surface-emitting semiconductor laser 2, the laser resonators of the two surface-emitting semiconductor lasers 1, 2 have a length difference. For example, in the first surface-emitting semiconductor laser 1, a semiconductor layer sequence 20 with a total thickness d is arranged between the first resonator mirror 21 and the second resonator mirror 22. In the second surface-emitting semiconductor laser 2, a spacer layer 23 with a thickness $\Delta d$ is arranged between the first resonator mirror 21 and the second resonator mirror 22 in addition to the semiconductor layer sequence 20 with the thickness d.

The first resonator mirrors 21 and the semiconductor layer sequences 20 can, for example, be grown simultaneously on the common growth substrate 10 for both surface-emitting semiconductor lasers 1, 2. When growing the spacer layer 23 on the second surface-emitting semiconductor laser 2, the semiconductor layer sequence 20 of the first surface-emitting semiconductor laser 1 can be masked, for example. Subsequently, for example, the two second resonator mirrors 22 are grown simultaneously on the two surface-emitting semiconductor lasers 1, 2.

In an alternative configuration of the manufacturing process, it would also be possible to first produce both semiconductor layer sequences 20 of the surface-emitting semiconductor lasers 1, 2 with the thickness $d+\Delta d$, and then to reduce the thickness of the semiconductor layer sequence 20 of the first surface-emitting semiconductor laser 1 by the thickness difference $\Delta d$, for example with a material-removing process such as an etching process.

The emission wavelength of surface emitting semiconductor lasers is generally $\lambda = 2 L \cdot n/q$. where L is the length of the laser cavity, q is an integer indicating the number of oscillations in the laser cavity, and n is the refractive index in the laser cavity, in particular the refractive index of the semiconductor material. The difference in length $\Delta d$ of the two laser resonators can, for example, be between 0.1 nm and 6 nm. For a wavelength difference of, for example, 1 nm, the length difference $\Delta d$ is, for example, ⅙ nm (for n=3 and q=2).

The arrangement of the two surface-emitting semiconductor lasers on the common carrier 10 has the advantage that the two surface-emitting semiconductor lasers are arranged close together and therefore exhibit the same thermal behavior. As a result, the wavelength difference between the surface-emitting semiconductor lasers 1, 2 remains advantageously approximately constant during operation.

The surface-emitting semiconductor lasers 1, 2 are preferably single-mode lasers which preferably have the same polarization. To achieve the same polarization, the at least two surface-emitting semiconductor lasers 1, 2 can, for example, have an elliptical beam aperture which is oriented identically in both surface-emitting semiconductor lasers. It is possible that the surface-emitting semiconductor lasers each have a beam shaping element 7 on the aperture in order to focus or collimate the emitted laser radiation 11, 12.

The invention is not limited by the description by means of the examples. Rather, the invention comprises each new feature as well as each combination of features, which in particular includes each combination of features in the claims, even if this feature or combination itself is not explicitly stated in the claims or examples.

REFERENCES 1 surface-emitting semiconductor laser
2 surface-emitting semiconductor laser
3 surface-emitting semiconductor laser
4 surface-emitting semiconductor laser
5 photomixer
6 terahertz radiation
7 beam shaping element
8 array
10 carrier
11 laser radiation
12 laser radiation
13 laser radiation
14 laser radiation
20 semiconductor layer sequence
21 first resonator mirror
22 second resonator mirror
23 spacer layer
51 photoconductive semiconductor material
52 antenna structure
53 electrode structure
100 terahertz radiation source

The invention claimed is:

1. A radiation source for emitting terahertz radiation, comprising:
   at least two laser light sources emitting laser radiation of different frequencies, and
   a photomixer comprising a photoconductive semiconductor material and an antenna structure,
   wherein the photomixer is configured to receive the laser radiation of the at least two laser light sources and to emit terahertz radiation with at least one beat frequency of the laser light sources,
   wherein the at least two laser light sources are surface-emitting semiconductor lasers arranged in a one-dimensional or two-dimensional array on a common carrier, the surface-emitting semiconductor lasers each comprise a laser resonator formed by a first resonator mirror and a second resonator mirror, and
   wherein the laser resonators have a length difference for adjusting the at least one beat frequency of the emitted laser radiation, and the length difference of the laser resonators of the at least two surface-emitting semiconductor lasers is between 0.1 nanometer (nm) and 6 nm.

2. The radiation source according to claim 1, wherein the common carrier is a growth substrate on which the surface-emitting semiconductor lasers are grown.

3. The radiation source according to claim 1, wherein the common carrier is a Gallium Arsenide (GaAs) substrate.

4. The radiation source according to claim 1, wherein the surface-emitting semiconductor lasers are based on an arsenide compound semiconductor, a phosphide compound semiconductor or an antimonide compound semiconductor.

5. The radiation source according to claim 1, wherein the surface-emitting semiconductor lasers have wavelengths in the wavelength range between 840 nanometer (nm) and 1600 nm.

6. The radiation source according to claim 1, wherein the number of surface-emitting semiconductor lasers in the radiation source is exactly two and the radiation source emits terahertz radiation of a single frequency.

7. The radiation source according to claim 1, wherein the number of surface-emitting semiconductor lasers in the radiation source is at least three and the radiation source emits terahertz radiation of different frequencies.

8. The radiation source according to claim 1, wherein the terahertz radiation has one or more frequencies in the frequency range between 0.1 terahertz (THz) and 30 THz.

9. The radiation source according to claim 1, wherein the surface-emitting semiconductor lasers each have a beam-shaping element which is integrated on the one- or two-dimensional array.

10. The radiation source according to claim 1, wherein the surface-emitting semiconductor lasers each comprise a laser resonator formed by a first resonator mirror and a second resonator mirror, and wherein the laser resonators have a length difference for adjusting the at least one beat frequency of the emitted laser radiation.

11. The radiation source according to claim 10, wherein the laser resonator of at least one of the surface-emitting semiconductor lasers has a spacer layer for adjusting the length difference.

12. The radiation source according to claim 10, wherein the length difference of the laser resonators of the at least two surface-emitting semiconductor lasers is between 0.1 nanometer (nm) and 6 nm.

13. The radiation source according to claim 1, wherein the one-dimensional or two-dimensional array of surface-emitting semiconductor lasers is fixedly connected to the photomixer.

14. The radiation source according to claim 1, wherein the common carrier of the surface-emitting semiconductor lasers faces the photomixer.

15. The radiation source according to claim 1, wherein the surface-emitting semiconductor lasers emit the laser radiation through the common carrier.

* * * * *